United States Patent
Suzuki (10) Patent No.: US 6,605,398 B2
(45) Date of Patent: Aug. 12, 2003

(54) METHODS AND APPARATUS FOR CONTROLLING BEAM BLUR IN CHARGED-PARTICLE-BEAM MICROLITHOGRAPHY

(75) Inventor: Shohei Suzuki, Hukaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/951,111

(22) Filed: Sep. 10, 2001

(65) Prior Publication Data

US 2002/0042009 A1 Apr. 11, 2002

(30) Foreign Application Priority Data

Sep. 8, 2000 (JP) .......................................... 2000-273884

(51) Int. Cl.$^7$ .............................. G03F 9/00; A61N 5/00
(52) U.S. Cl. ......................... 430/30; 430/296; 430/942; 250/492.2; 250/492.3
(58) Field of Search .......................... 430/30, 296, 942; 250/492.2, 492.3

(56) References Cited

U.S. PATENT DOCUMENTS 6,096,462 A  *  8/2000  Suzuki ........................ 430/30
6,337,164 B1 *  1/2002  Nakasuji ..................... 430/30
6,432,594 B1 *  8/2002  Kamijo ....................... 430/30

* cited by examiner

*Primary Examiner*—Christopher G. Young
(74) *Attorney, Agent, or Firm*—Klarquist Sparkman LLP (57) ABSTRACT

Charged-particle-beam (CPB) microlithography methods and apparatus are disclosed with which large single-shot image-transfer regions (subfields) can be exposed using maximal beam current. Beam current is changed over a selected range to determine a suitable range of beam-spread angles that include the maximum permissible values for average blur, Δblur, and distortion. Assuming that that range of beam-spread half-angles is between α1 and α2, then the beam current for which α1=α2 is designated as a cutoff beam current. The beam-spread half-angle at that beam current is the optimal beam-spread half-angle. The ratio between the distribution half-angle and the cutoff half-angle is varied, and a determination is made of the distribution half-angle and cutoff half-angle that will accommodate the greatest beam current. Thus, a maximum beam current can be used while maintaining blur and distortion of the projected subfield image within specified values set for them.

6 Claims, 5 Drawing Sheets

METHODS AND APPARATUS FOR CONTROLLING BEAM BLUR IN CHARGED-PARTICLE-BEAM MICROLITHOGRAPHY

FIELD

This disclosure pertains to, inter alia, microlithography (lithographic transfer-exposure of extremely fine patterns using an energy beam). Microlithography is a key technology used in the manufacture of microelectronic devices such as semiconductor integrated circuits, displays, thin-film magnetic pickup heads, micromachines, and the like. More specifically, this disclosure pertains to microlithography as performed using a charged particle beam (e.g., an electron beam or ion beam) under conditions in which beam blur is minimized.

BACKGROUND

Figure 4:
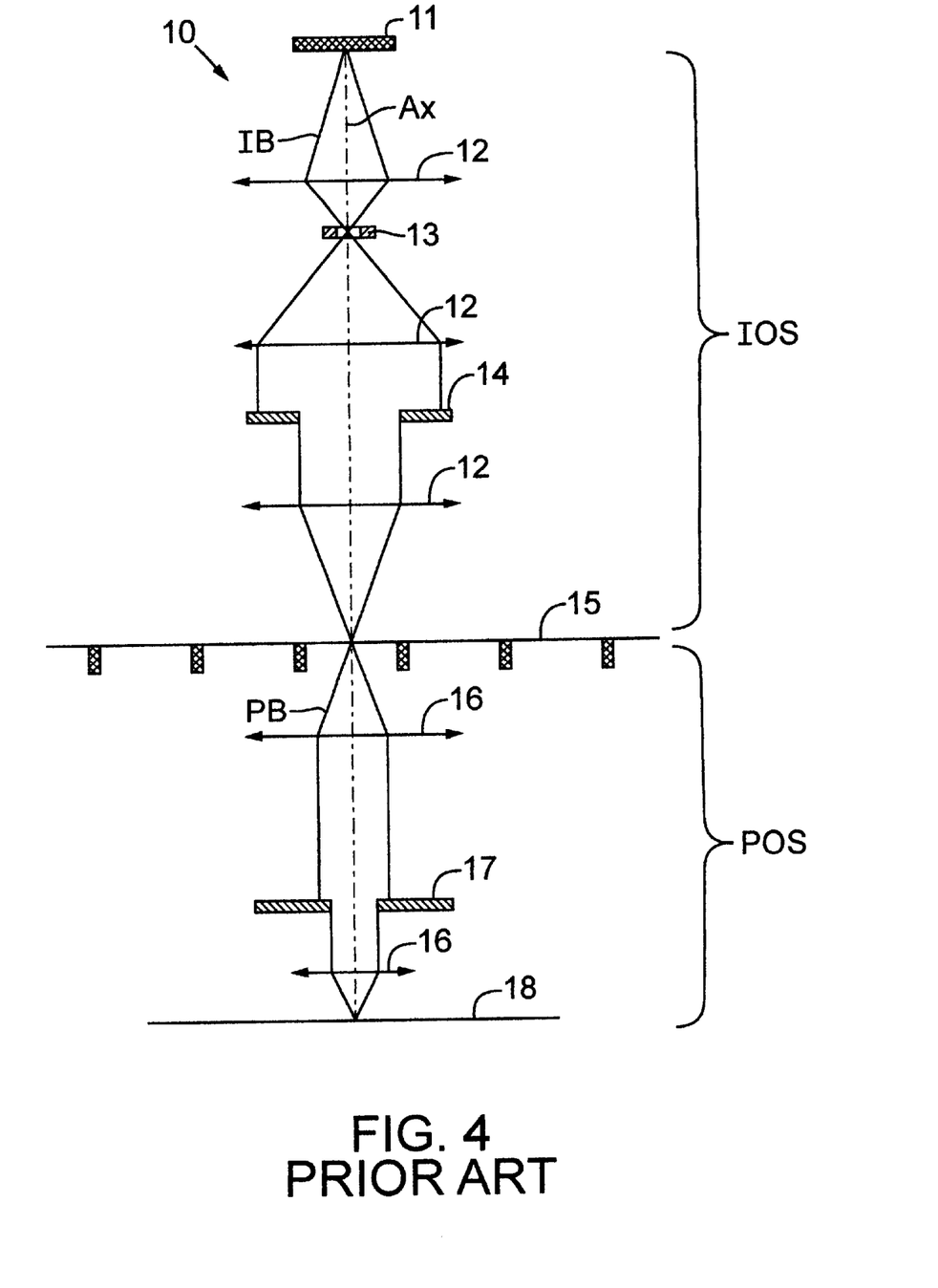
FIG. 4 is a schematic elevational diagram depicting certain components of a conventional electron-beam projection-microlithography apparatus.

Certain aspects of an exemplary conventional charged-particle-beam (CPB) microlithography apparatus 10 are depicted in FIG. 4. The depicted apparatus 10 utilizes an electron beam as the charged particle beam. The electron beam is produced by an electron-beam source 11 (i.e., "electron gun"). The electron beam from the source 11 propagates in a downstream direction (vertically downward in the figure) through an illumination-lens assembly 12, a beam-shaping aperture 13, and an aperture stop 14 to a reticle 15. The reticle 15 defines a pattern to be projection-transferred to a substrate 18 (e.g., semiconductor wafer having an upstream-facing surface coated with a suitable resist). The electron beam propagating from the source 11 to the reticle 15 is termed an "illumination beam" IB and the electron-optical components located between the source 11 and the reticle 15 collectively constitute an "illumination-optical system" IOS that extends along an optical axis Ax. From the reticle 15, the electron beam passes through a projection-lens assembly 16 and an aperture stop 17 to the substrate 18. The electron beam propagating from the reticle 15 to the substrate 18 is termed a "patterned beam" or "imaging beam" PB, and the electron-optical components situated between the reticle 15 and substrate 18 collectively constitute a "projection-optical system" POS that extends along the optical axis Ax. The illumination-optical system IOS and projection-optical system POS collectively are termed the "CPB-optical system."

The illumination beam IB is manipulated by the illumination-optical system IOS so as to illuminate a selected region (e.g. a selected "subfield") on the reticle 15 in a uniform manner. An image of the illuminated region of the reticle 15 is formed on the substrate 18 by the projection-optical system POS. So as to be imprinted with the image, the upstream-facing surface of the substrate 18 is coated with a suitable resist. Such a substrate is termed "sensitive" to the patterned beam PB. The aperture stops 14, 17 trim the illumination beam IB and patterned beam PB, respectively, so as to limit the angular aperture of the respective beam. Situated at a location that is optically conjugate to the reticle 15 is the beam-shaping aperture 13, which limits the size and shape of the region on the reticle 15 that is illuminated by the illumination beam IB.

A well-known phenomenon associated with electron-beam microlithography is the "Coulomb Effect" in which repulsion between individual electrons in the beam results in a downstream shift of the focal point. This shift causes blur and distortion of the image as formed on the substrate 18. In conventional electron-beam microlithography systems that operate according to the well-known variable-shaped beam and cell-projection-exposure schemes, it is desirable that the respective upper limits for beam-spread half-angle and exposure beam current be set so as to minimize a "total" blur (i.e., blur resulting from both the Coulomb Effect and geometrical aberrations of the CPB-optical system).

As used herein, the term "blur" generally refers to the maximum blur evident in an exposed region, on the sensitive substrate, corresponding to a single illuminated region (generally termed a "subfield") on the reticle. As a result of blur, the edge of a pattern element as exposed on the resist does not exhibit an abrupt change from 100% relative beam-current density to 0% relative beam-current density. Rather, the fall-off in relative beam-current density at the edge exhibits a sloped distribution profile. As a result of blur, the respective distributions of relative beam-current density associated with, for example, opposing edges of adjacent lines of the pattern can extend across the intervening space sufficiently to interfere with the proper exposure of the lines, possibly causing a bridging exposure between the lines and/or an undesired change in profile of the lines as exposed on the substrate.

Figure 5:
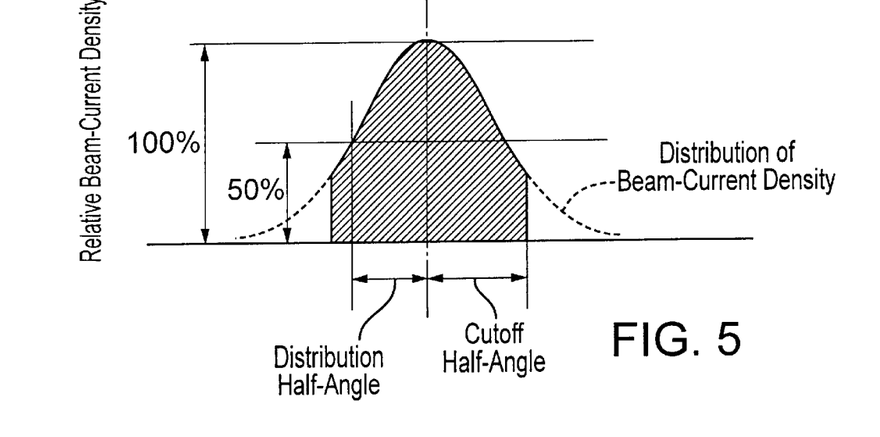
FIG. 5 is plot of an exemplary distribution of beam-current density, showing the distribution half-angle and cutoff half-angle of the distribution.

In this regard, two types of beam half-angle are of interest: the beam-spread half-angle (as noted above) and the beam-cutoff half-angle. The "beam-spread half-angle" is a half-angle (also termed "distribution half-angle") corresponding to half the width of the distribution of beam-current density within this range of ±50% relative beam-current density (i.e., width between the apex of the distribution of beam-current density and the + or −50% value of relative beam-current density, as shown in FIG. 5). The "beam-cutoff half-angle" is a half-angle (also termed "cutoff half-angle") corresponding to half the width of the distribution of beam-current density within the range bounded by the + and − cutoff points on the distribution curve at which respective tails of the distribution are trimmed off by an aperture stop 14 or 17.

Using the foregoing concepts, a conventional determination of blur is performed based on edge profiles of a projected test pattern element. The test element normally is rectangular and is substantially larger than the estimated beam blur. Measurements are obtained of the beam-current density across the projected pattern element, including the edges of the projected element. Two threshold values (lower and upper) are set within the determined distribution of beam-current density across the element, and blur is defined as the distance between the two thresholds. The threshold values normally are set at 12% and 88%, or 10% and 90%, of the maximum value (apex) of the distribution curve. The following description will refer to the example of FIGS. 6(a)–6(c), in which the lower and upper thresholds are set at 12% and 88%, respectively.

Figure 6:
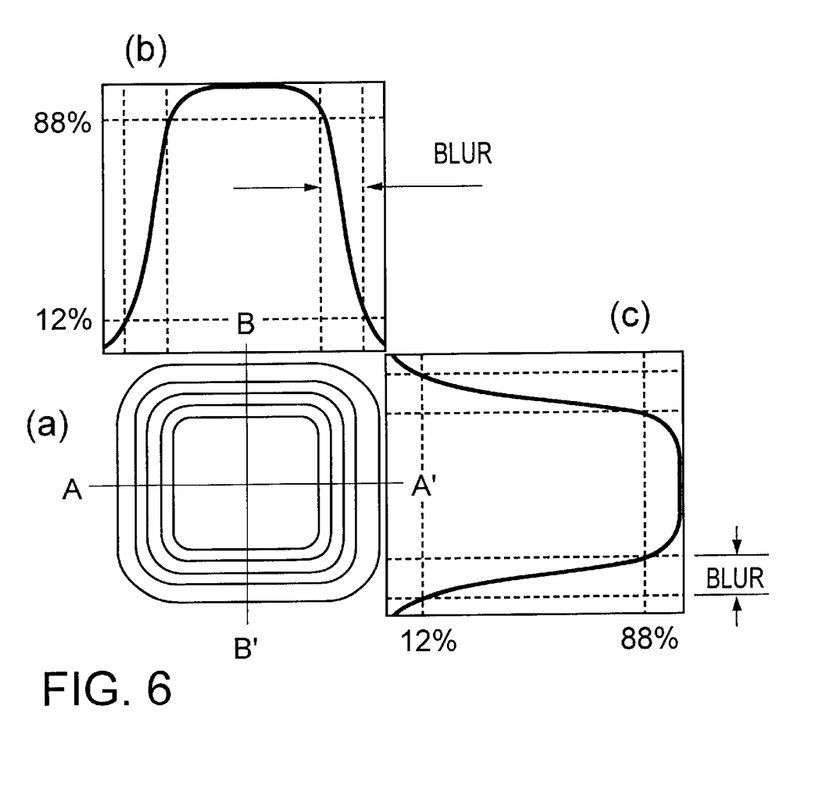
FIG. 6(a) is a contour diagram of a projected pattern element.
FIGS. 6(b) and 6(c) are respective plots of relative beam-current density that reveal blur in the X and Y directions, respectively.

FIG. 6(a) is a contour drawing of the beam-current distribution for an exemplary, projected rectangular pattern element. The distribution of beam current exhibits a high plateau (nominally 100% relative intensity) in the center of the projected element, with a rapid decline (cutoff) at the edges of the projected element. FIGS. 6(b) and 6(c) show beam cutoff (edge profiles) of sections A–A' and B–B', respectively, of the projected element. In this example, blur is defined as the distance between the 12% and 88% thresholds of relative intensity in each edge profile, as indicated in FIGS. 6(b) and 6(c). Selecting an optimum beam-spread half-angle for minimizing this blur is determined by actual measurement or simulation.

Figure 7:
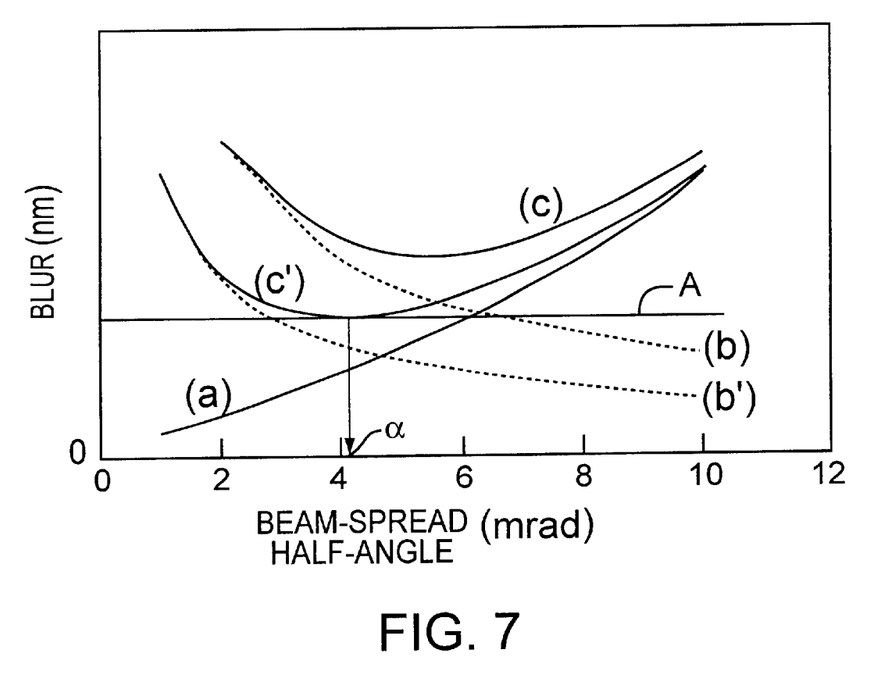
FIG. 7 is a plot of blur versus beam-spread half-angle, which depicts certain aspects of a conventional method for determining an optimum beam-spread half-angle.

A conventional method for determining beam-spread half-angle is described with reference to FIG. 7. To simplify the description, it is assumed that the cutoff half-angle and distribution half-angle (FIG. 5) are equal to each other. In FIG. 7, curve (a) represents beam blur due to geometrical aberration of the electron-optical system at maximum lateral deflection of the beam; curve (b) represents beam blur due to the Coulomb Effect for a given exposure beam current at maximum deflection; and curve (c) represents total blur, which is a composite of curve (a) and curve (b).

Blur due to geometrical aberration (curve (a)) increases with increases in the beam-spread half-angle. Blur due to the Coulomb Effect (curve (b)), on the other hand, decreases with increases in the beam-spread half-angle. Hence, there is a beam-spread half-angle at which total blur (curve (c)) is at a minimum.

In FIG. 7, the horizontal line A denotes a specified blur tolerance (maximum allowable blur). If the total blur (curve (c)) has a minimum exceeding the blur threshold represented by the line A, then the exposure beam current is reduced as required to bring the total blur to within the specified tolerance. Reducing the exposure beam current does not affect blur due to geometrical aberration (curve (a)), but it does reduce blur due to the Coulomb Effect (curve (b)). As a result, total blur (curve (c)) is reduced sufficiently to provide a beam-spread half-angle at which the total blur is at or below the line A. For example, the curve (b') represents an exemplary reduced blur due to the Coulomb Effect. Adding curve (b') to the curve (a) yields a total blur (curve (c')) that is sufficiently shifted downward to contact the line A. The point of contact of the curve (c') with the line A is denoted "α", which is the beam-spread half-angle providing the minimum total blur satisfying the blur specification. Hence, in this conventional method, α is regarded as the optimum beam-spread half-angle for the exposure system.

For simplicity in the discussion above, the cutoff half-angle was assumed to equal to the distribution half-angle. However, these half-angles actually are different in practice. As a result, changes in the cutoff half-angle and/or distribution half-angle are made while maintaining the relationship: cutoff half-angle=N×(distribution half-angle), wherein N for practical purposes is a number between 0.5 and 2.0. After making each change in the cutoff half-angle and/or distribution half-angle, the total blur as represented by the curve (c') of FIG. 7 is determined. Also determined, for each change, are the optimum distribution half-angle α(N) and optimum exposure beam current I(N). The values α(N) and I(N) express the optimum beam-spread half-angle and exposure current, respectively, corresponding to a particular distribution half-angle, as functions of N. Each change involves a change in N. Estimations or simulations are repeated for each N until an optimum N value providing the maximum exposure beam current I(N) is found. The corresponding value of α(N) for the optimum N value is then regarded as the optimum distribution half-angle, and α(N)×N is regarded as the corresponding cutoff half-angle. In other words, using the distribution half-angle and cutoff half-angle thus obtained allows the maximum possible electron-beam current to be determined and used while maintaining the total blur within tolerance.

In conventional electron-beam microlithography systems that operate according to the variable-shaped beam and cell-projection schemes, the maximum size of an image transferred to the exposed surface of the substrate in a single exposure "shot" is about 5 μm square. Because this image area is so small, distortion and "Δblur" are sufficiently small for such variations to be ignored. ("Δblur" is the difference of minimum blur from maximum blur within an image of a single subfield.) In reduced-image projection microlithography systems of recent interest, however, the size of the transferred image (i.e., subfield size) per exposure "shot" is about several hundred μm square. In this latter situation, Δblur and distortion within the projected subfield can easily approach or exceed specified threshold tolerances (e.g., Δblur within subfield <10 nm, and distortion within subfield <5 nm).

Therefore, during determinations of the optimum beam-spread angle for reduced-image projection microlithography, it has become apparent that, in many cases, if the beam-spread half-angle were determined in the conventional manner (i.e., by considering only the total blur in the image plane), the blur specification would be satisfied, but other specifications (e.g., for Δblur and distortion) would not be met. In such instances, to satisfy all these specifications, there was no choice but to further reduce the exposure beam current, thereby substantially reducing throughput.

Also, until recently, the performance of resists sensitive to CPB exposure was poor. As a result, fine line-and-space patterns (e.g., lines and intervening spaces each having a width of 150 nm or less) could not be transferred. When exposing a pattern onto a layer of one of these earlier resists, a relatively high total blur could be tolerated because the total blur still was significantly less than a linewidth. For example, if the pattern has lines and spaces each having a width of 180 nm, a blur of 70 nm could be tolerated without causing excessive loss of resolution of lines and spaces. As a result, the effect, on regions of the resist situated in intervening spaces, of beam currents less than 10% of maximum relative beam-current density (representing the "tails" of the respective distributions of relative beam-current density) could be ignored.

The performance of resists sensitive to charged-particle-beam exposure, however, has recently undergone marked improvement. Hence, it is now possible to expose patterns with much finer lines and intervening spaces (e.g., less than 100 nm) than previously, using a charged particle beam. With such an improved resist, the total blur could be nearly equal to the minimum linewidth (critical dimension) of the pattern. This situation can result in the tails of respective distributions of relative beam-current density extending across the intervening space between adjacent lines of the pattern sufficiently to cause an elevated level of exposure in the space and thus interfere with satisfactory resolution of adjacent lines. This crosstalk between adjacent lines undesirably alters the shape of the respective pattern elements as exposed on the wafer. In other words, with these new resists being used for exposure of fine line-and-space patterns, the tails of the respective distributions of relative beam-current density can no longer be ignored.

SUMMARY

In view of the shortcomings of conventional methods as summarized above, an object of the instant claims is to provide charged-particle-beam (CPB) exposure apparatus in which substantially greater maximum beam currents than conventionally can be used while still achieving highly accurate transfer of pattern elements, even when exposing patterns having narrow linewidths and large single-shot transfer areas.

To such end, and according to a first aspect of the invention, methods are provided in the context of methods for forming a projected image of a pattern, defined by a reticle, on a sensitive substrate situated on a projected-image plane using a charged particle beam passing through a CPB-optical system. The methods are directed to controlling blur of the projected image as formed by the charged particle beam on the substrate. According to an embodiment of such a method, the charged particle beam is configured to have, at the projected-image plane, a distribution half-angle and a cutoff half-angle such that, at maximum lateral deflection of the beam within the projected subfield, total blur, Δblur, and distortion (all as caused by geometrical aberrations and Coulomb Effects) within the projected subfield are all no greater than respective threshold values.

Hence, values of distribution half-angle and cutoff half-angle are no longer simply determined, according to conventional practice, such that the specification for total blur at maximum beam deflection is satisfied. Rather, the inventive methods also include determinations of the distribution half-angle and the cutoff half-angle such that total blur, Δblur, and distortion of the image within the projected subfield also are no greater than respective specified thresholds. Accordingly, even in CPB exposure systems that can accommodate large single-shot transfer areas (subfields), specified values for total blur, Δblur, and distortion within the projected subfield image can be maintained. This makes it possible to use the maximum practicable beam current while still maintaining accurate image-transfer accuracy within the subfield image.

The distribution half-angle and cutoff half-angle in the projected subfield image can be determined by taking into account the spread of tails of distribution profiles of the charged particle beam. (An exemplary tail is a portion of the distribution profile in which beam-current values are no greater than 10% of maximum relative beam current.) By setting lower threshold values, used in the conventional definition of blur (a threshold of 10%, for example) in this manner, the corresponding tail portions of the beam-current distribution can be taken into account when performing measurements. I.e., the included tail portions are not ignored in simulations, calculations, or the like. Because the tail portions are taken into account when determining the beam-spread half-angle and cutoff half-angle, pattern lines can be narrower than previously. Also a maximum beam current can be used while still maintaining image-transfer accuracy, even when the spacing between adjacent lines of the pattern is narrow.

According to another aspect of the invention, CPB exposure apparatus are provided. An embodiment of such an apparatus includes a CPB-optical system including an illumination-optical system situated upstream of a pattern-defining reticle and a projection-optical system situated between the reticle and a substrate. The CPB-optical system is configured to control blur of the projected image as formed by the charged particle beam on the substrate. This control is achieved by configuring the charged particle beam to have, within a projected subfield at a projected-image plane, a distribution half-angle and a cutoff half-angle. These half-angles are configured such that, at maximum lateral deflection of the beam within the projected subfield, total blur, Δblur, and distortion (all as caused by geometrical aberrations and by Coulomb Effects), within the projected subfield image are all no greater than respective threshold values.

In another method embodiment for forming a projected image of a pattern, defined by a reticle, on a sensitive substrate using a charged particle beam passing through a CPB-optical system, a method is provided for determining an optimum beam-cutoff half-angle of the charged particle beam. A first step involves an assumption that the charged particle beam has a cutoff half-angle equal to the distribution half-angle. The blur, Δblur, and distortion of the beam are determined at maximum lateral deflection at the projected-image plane, wherein the blur, Δblur, and distortion are as caused by geometric distortion and Coulomb Effects. A range of beam-spread half-angles is determined in which blur, Δblur, and distortion are all at or below respective thresholds, wherein the range is situated between respective abscissa coordinates α1, α2 of plots of blur, Δblur, and distortion. A beam-spread half-angle is determined at which α1=α2. Then, the respective distributions of half-angle and cutoff half-angle are changed while maintaining a relationship in which cutoff half-angle=N(distribution half-angle), wherein N is a number, other than 1, between 0.5 and 2. An optimum distribution half-angle (α(N)) and optimum beam current I(N) are determined. This step is repeated until a value of N is determined (N=$N_m$) at which beam current (I(N)) is at a maximum, thereby yielding a beam-spread half-angle (α($N_m$)) corresponding to $N_m$. Then, the optimum beam-cutoff half-angle is determined according to the expression α($N_m$)×$N_m$.

Other aspects of the invention pertain to methods for producing a microelectronic device using a CPB exposure apparatus as summarized above, and to microelectronic devices made by such methods.

The foregoing and additional features and advantages of the invention will be more readily apparent from the following detailed description, which proceeds with reference to the accompanying drawings.

DETAILED DESCRIPTION

Representative embodiments of charged-particle-beam (CPB) microlithography apparatus and methods are described below in the context of the CPB microlithography apparatus shown in FIG. 4. Features of the subject apparatus that are similar to corresponding features shown in FIG. 4 are not described further below.

First, a method for determining the optimum beam-spread half-angle is described. For simplicity, it is first assumed that the cutoff half-angle equals the distribution half-angle. Shown in FIGS. 1(a), 1(b), and 1(c), respectively, are plots of average blur (a mean of blur caused by geometric distortion plus blur caused by Coulomb Effects), Δblur, and distortion of a projected subfield image, all within the transferred subfield image and at maximum lateral beam deflection, as determined by simulation or experimentation. For determination of blur, threshold levels of 5% and 90% of maximum relative beam-current density were used so as to take into account the influence of the respective tails of the distributions of beam-current density associated with adjacent pattern elements.

Figure 1A:
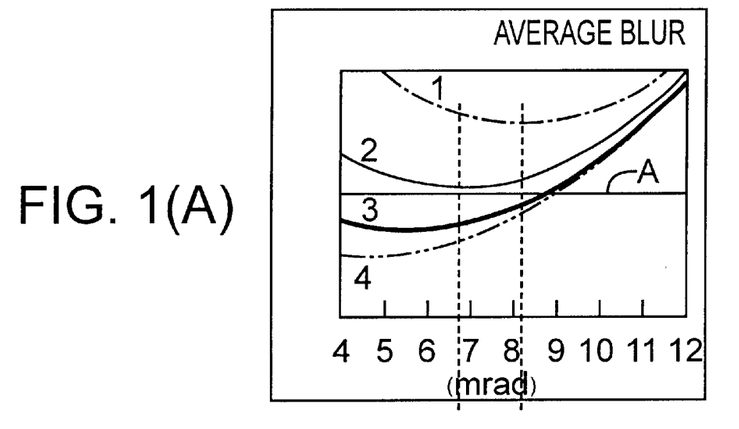
FIGS. 1(a)-1(c) are respective plots of average blur, Δblur, and distortion, respectively, of a projected image in an image plane at maximum lateral beam deflection, illustrating aspects of a representative embodiment of a method according to the invention for determining an optimum beam-spread half-angle.
Figure 1B:
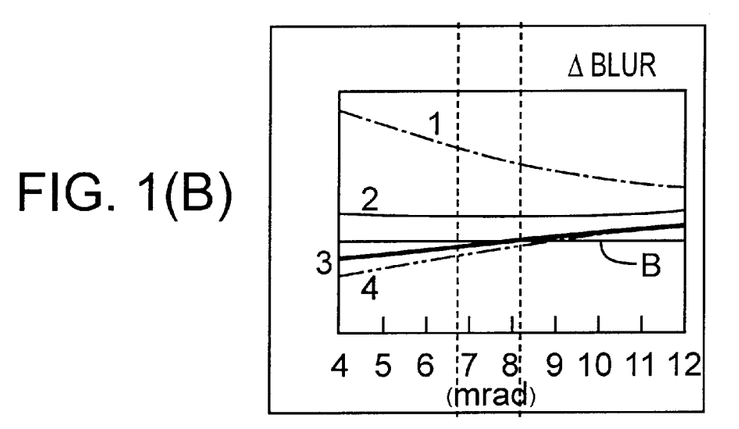
Figure 1C:
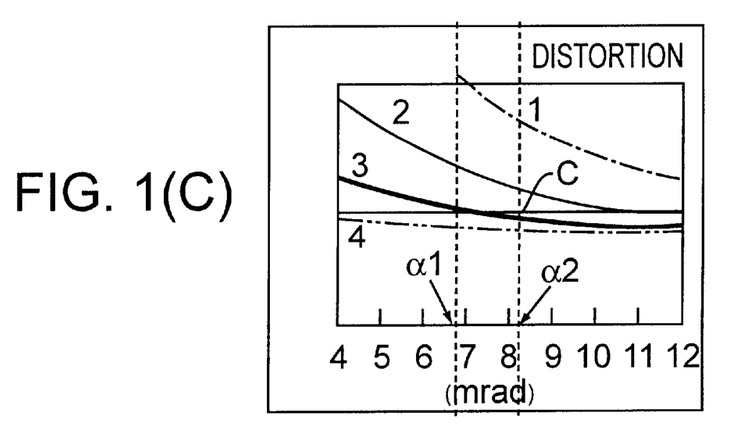

Distortion (FIG. 1(c)) is defined according to an x,y coordinate system in which the center, within the image plane, of a projected image is regarded as the origin. Because (x,y) zeroth- and first-order distortions can be corrected using a minimum of two stigmators, three focus coils, and one deflector, the distortion shown in FIG. 1(c) is only the distortion greater than (x,y) first-order distortion.

Each of FIGS. 1(a)–1(c) includes four curves that are plots of average blur, Δblur, and distortion, respectively, at four different respective beam currents. The beam current at the exposed surface is highest in curve 1, and is progressively smaller in curves 2, 3, and 4, respectively, with curve 4 indicating the lowest beam current. The straight horizontal lines A, B, C in FIGS. 1(a)–1(c), respectively, indicate respective threshold specifications for average blur, Δblur, and distortion.

For example, for the beam current denoted by curve 3, the range of beam-spread half-angles is a range in which average blur, Δblur, and distortion are all at or below their respective thresholds A, B, C. This range of beam-spread half-angles is situated between the respective abscissa coordinates α1 and α2 of the two vertical dotted lines. In the depicted example, the lower threshold α1 of beam-spread half-angle is dictated by the maximum permissible distortion (where curve 3 crosses line C in FIG. 1(c)), and the upper threshold α2 of beam-spread half-angle is dictated by the maximum permissible Δblur (where curve 3 crosses line B in FIG. 1(b)).

With finer adjustment between the respective beam currents represented by curves 2 and 3, a beam-spread half-angle is found at which α1=α2. (Whenever α1 =α2, maximum beam current is obtained with permissible blur, Δblur, and distortion. The maximum beam current allows high throughput to be obtained.) The corresponding beam current provides an optimum beam-spread half-angle for the case in which the cutoff half-angle equals the distribution half-angle. The beam current under such a condition is the maximum beam current that satisfies respective specifications for blur, Δblur, and distortion.

Next, it is assumed that the cutoff half-angle does not equal the distribution half-angle; i.e., the cutoff half-angle is varied around the distribution half-angle according to the relationship: cutoff half-angle=(distribution half-angle)×N. At each changed value of the cutoff half-angle, the blur, Δblur, and distortion may be changed. Hence, the distribution half-angle α(N) and beam-current I(N) are optimized at each selected value of N (other than N=1) within the range of 0.5 to 2. This process is repeated until a value of N is determined at which beam current I(N) is maximum. The resulting value of N is denoted $N_m$. The beam-spread half-angle $\alpha(N_m)$ corresponding to $N_m$ is the final optimum distribution half-angle being sought. The optimum cutoff half-angle is then given by $\alpha(N_m) \times N_m$. Under these conditions blur, Δblur, and distortion are within specifications while obtaining the highest possible beam current.

In this embodiment, the threshold values for determining blur were selected based on the influence of the tails of the respective distributions of beam-current density at the edges of the test pattern element. It will be apparent that a new specified value for the width of each tail can be set, and an optimum beam-spread half-angle found, by determining the cutoff and distribution half-angles that will take into account the maximum beam current, on the condition that this specification also is satisfied, in addition to the three conditions discussed above.

Figure 2:
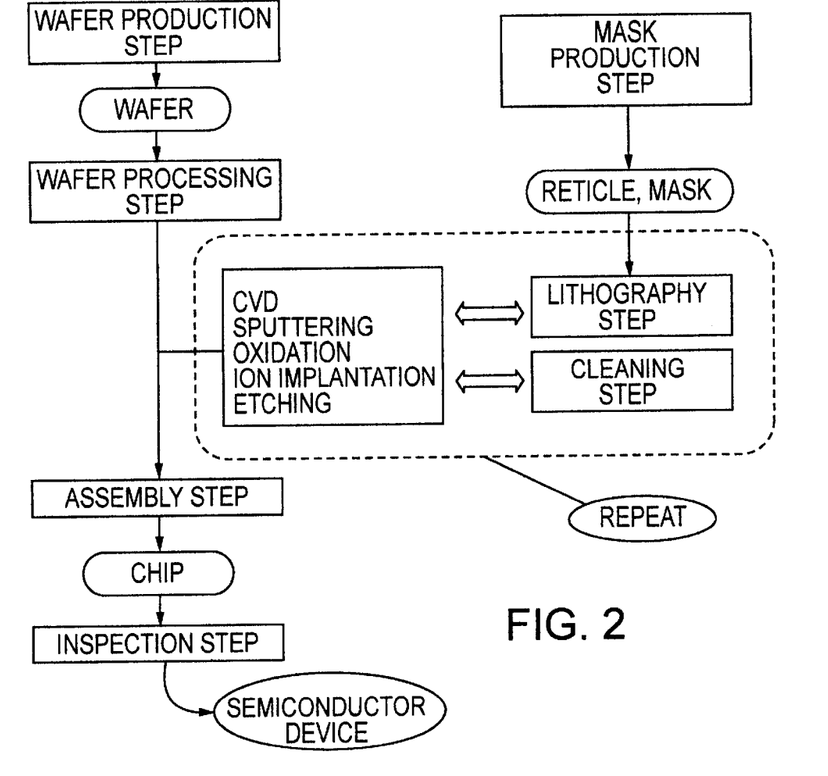
FIG. 2 is a flow chart of certain steps in a process for manufacturing a microelectronic device.

FIG. 2 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 3:
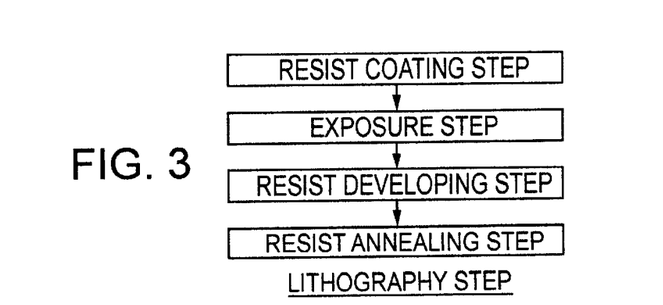
FIG. 3 is a flow chart of certain steps of the microlithography step included in the flow chart of FIG. 2.

FIG. 3 provides a flowchart of typical steps performed in microlithography, which is a principal step in the wafer-processing step shown in FIG. 2. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Because a CPB microlithography apparatus as described above is used for performing lithographic transfer-exposure, large-area portions of a pattern can be exposed at maximum current with good accuracy. This provides microelectronic device manufacturing with improved accuracy and throughput. Even with a CPB microlithography apparatus capable of making individual exposures on large single-shot image-transfer regions, it is possible to use the maximum beam current that can be used while still maintaining variances in blur and distortion of the projected image in the plane of the projected image within respective specifications.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a method for forming a projected image of a pattern, defined by a reticle, on a sensitive substrate situated on a projected-image plane using a charged particle beam passing through a charged-particle-beam (CPB) optical system, a method for controlling blur of the projected image as formed by the charged particle beam on the substrate, the method comprising:

configuring the charged particle beam to have, within a projected subfield at the projected-image plane, a distribution half-angle and a cutoff half-angle such that, at maximum lateral deflection of the beam within the projected subfield, total blur, $\Delta$blur, and distortion (all as caused by geometrical aberrations and Coulomb Effects) within the projected subfield are all no greater than respective threshold values.

2. The method of claim 1, wherein the distribution half-angle and cutoff half-angle in the projected subfield are determined by taking into account a spread of a tail of a distribution profile of the charged particle beam, the tail being a portion of the distribution profile in which beam-current values are no greater than 10% of a maximum in the distribution profile.

3. A charged-particle-beam (CPB) exposure apparatus, comprising:

a CPB-optical system including an illumination-optical system situated upstream of a pattern-defining reticle and a projection-optical system situated between the reticle and a substrate; and the CPB-optical system being configured to control blur, of the projected image as formed by the charged particle beam on the substrate, by configuring the charged particle beam to have, within a projected subfield at a projected-image plane, a distribution half-angle and a cutoff half-angle such that, at maximum lateral deflection of the beam within the projected subfield, total blur, $\Delta$blur, and distortion (all as caused by geometrical aberrations and by Coulomb Effects), within the projected subfield image that are all no greater than respective threshold values.

4. In a method for forming a projected image of a pattern, defined by a reticle, on a sensitive substrate situated on a projected-image plane using a charged particle beam passing through a charged-particle-beam (CPB) optical system, a method for determining an optimum beam-cutoff half-angle of the charged particle beam, the method comprising:

(a) assuming that the charged particle beam has a cutoff half-angle equal to a distribution half-angle, determining blur, $\Delta$blur, and distortion of the beam at maximum lateral deflection in a projected subfield at the projected-image plane, wherein blur, $\Delta$blur, and distortion are as caused by geometric distortion and Coulomb Effects;

(b) determining a range of beam-spread half-angles in which blur, $\Delta$blur, and distortion are all at or below respective thresholds, wherein the range is situated between respective abscissa coordinates $\alpha 1$, $\alpha 2$ of plots of blur, $\Delta$blur, and distortion;

(c) determining a beam-spread half-angle at which $\alpha 1 = \alpha 2$;

(d) changing respective distributions of half-angle and cutoff half-angle while maintaining a relationship in which cutoff half-angle=N(distribution half-angle), wherein N is a number, other than 1, between 0.5 and 2;

(e) determining an optimum distribution half-angle ($\alpha(N)$) and optimum beam current I(N);

(f) repeating step (e) until a value of N is determined ($N=N_m$) at which beam current (I(N)) is at a maximum, thereby yielding a beam-spread half-angle ($\alpha(N_m)$) corresponding to $N_m$; and (g) determining the optimum beam-cutoff half-angle $\alpha(N_m) \times N_m$.

5. A method for producing a microelectronic device, comprising transfer-exposing a pattern, defined by a reticle, onto a sensitive layer on a surface of a wafer using a charged particle beam passing through a charged-particle-beam (CPB) exposure apparatus, the CPB exposure apparatus comprising (i) a CPB-optical system including an illumination-optical system situated upstream of the reticle and (ii) a projection-optical system situated between the reticle and the wafer, the CPB-optical system being configured to control blur, of a projected image as formed by the charged particle beam on the wafer, by configuring the charged particle beam to have, at a projected-image plane, a distribution half-angle and a cutoff half-angle such that, at maximum lateral deflection of the beam within the projected subfield, total blur, $\Delta$blur, and distortion (all as caused by geometrical aberrations and by Coulomb Effects) within the projected subfield that are all no greater than respective threshold values.

6. A microelectronic device, produced using the method as recited in claim 5.

* * * * *

UNITED STATES PATENT AND TRADEMARK OFFICE
CERTIFICATE OF CORRECTION

PATENT NO. : 6,605,398 B2
DATED : August 12, 2003
INVENTOR(S) : Suzuki

It is certified that error appears in the above-identified patent and that said Letters Patent is hereby corrected as shown below:

Column 3,
Line 35, "to equal to" should be -- to be equal to --.

Column 8,
Lines 48-49, "which an include" should be -- which can include --.

Signed and Sealed this

Eighteenth Day of November, 2003

JAMES E. ROGAN
*Director of the United States Patent and Trademark Office*